US007949970B1

(12) United States Patent
Korobkov et al.

(10) Patent No.: US 7,949,970 B1
(45) Date of Patent: May 24, 2011

(54) FAST REDUCTION OF SYSTEM MODELS

(75) Inventors: Alexander Korobkov, San Jose, CA (US); Wai Chung W. Au, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 851 days.

(21) Appl. No.: 11/874,053

(22) Filed: Oct. 17, 2007

(51) Int. Cl.
*G06F 9/45* (2006.01)

(52) U.S. Cl. ........................................ 716/103
(58) Field of Classification Search ............ 716/103
See application file for complete search history.

(56) References Cited

U.S. PATENT DOCUMENTS

| | | | | |
|---|---|---|---|---|
| 6,842,750 | B2 * | 1/2005 | Andreev et al. ............ | 1/1 |
| 2003/0043827 | A1 * | 3/2003 | Teig et al. ............ | 370/408 |
| 2003/0065965 | A1 * | 4/2003 | Korobkov ............ | 713/500 |
| 2006/0047680 | A1 * | 3/2006 | Paruthi et al. ............ | 707/102 |
| 2008/0109774 | A1 * | 5/2008 | Baumgartner et al. ......... | 716/5 |
| 2008/0282207 | A1 * | 11/2008 | Baumgartner et al. ......... | 716/4 |

OTHER PUBLICATIONS

Sheehan et al.; "TICER: Realizable Reduction of Extracted RC Circuits"; 1999; IEEE; pp. 1-4.*
Guy E. Blelloch et al., "Fast Set Operations Using Treaps," $10^{th}$ Annual ACM Symposium on Parallel Algorithms and Architectures (SPAA'98), Jun. 28-Jul. 2, 1998, Puerto Vallarta, Mexico, pp. 1-11.

Masud H. Chowdhury et al., "Realizable Reduction of RLC Circuits Using Node Elimination," 0-7803-7761-3/03/-IEEE, 2003, pp. III-494-III-497.
Conrado Martinez et al., "Randomized Binary Search Trees," Journal of the ACM, vol. 45, No. 2, Mar. 1998, pp. 288-323.
Zhanhai Qin et al., "Realizable Parasitic Reduction Using Generalized Y-Δ Transformation," DAC 2003, Jun. 2-6, 2003, Anaheim, CA, USA, pp. 220-225.
Vasant B. Rao et al., "Aggressive Crunching of Extracted RC Netlists," *TAU'02*, Dec. 2-3, 2002, Monterey, CA, USA, pp. 70-77.
Bernard N. Sheehan, "TICER: Realizable Reduction of Extracted RC Circuits," 0-7803-5832-5/99-IEEE, 1999, pp. 200- 203.
Guy E. Blelloch et al., "Fast Set Operations Using Treaps," $10^{th}$ Annual ACM Symposium on Parallel Algorithms and Architectures (SPAA'98), Jun. 28 —Jul. 2 1998, Puerto Vallarta, Mexico, pp. 1-11.

(Continued)

*Primary Examiner* — Sun J Lin
*Assistant Examiner* — Suresh Memula
(74) *Attorney, Agent, or Firm* — Osha• Liang LLP

(57) ABSTRACT

Techniques are provided for fast reduction of a system model, such as fast parasitics reduction of an electrical design. Delta loops, which comprise three nodes connected by three edges, may be identified. The netlist can be annotated with the number of delta loops to which an edge belongs and a delta loop identifier. Delta loops that share an edge may be assigned the same identifier. Identifying delta loops may be based on the intersection of binary search trees that are based on the netlist. In one embodiment, a cost of removing a node from the netlist is determined. Based on the annotations to the edges connected to a node under consideration for removal, the total number of delta loops that are shared by pairs of edges is determined. Based, at least in part, on the total number of common delta loops, a cost is determined of removing the node.

11 Claims, 15 Drawing Sheets

OTHER PUBLICATIONS

Masud H. Chowdhury et al., "Realizable Reduction of *RLC* Circuits Using Node Elimination," 0-7803-7761-3/03/-IEEE, 2003, pp. III-494—III-497.

Conrado Martinez et al., "Randomized Binary Search Trees," Journal of the ACM, vol. 45, No. 2, Mar. 1998, pp. 288-323.

Zhanhai Qin et al., "Realizable Parasitic Reduction Using Generalized Y-ΔTransformation," DAC 2003, Jun. 2-6, 2003, Anaheim, CA, USA, pp. 220-225.

Vasant B. Rao et al., "Aggressive Crunching of Extracted RC Netlists," *Tau'02*, Dec. 2-3, 2002, Monterey, CA, USA, pp. 70-77.

Raimund Seidel et al., "Randomized Search Trees," Computer Science Division, University of California Berkeley, Universitat des Saarlandes, Saarbrucken, Germany, 33 pages. 1996.

Bernard N. Sheehan, "TICER: Realizable Reduction of Extracted RC Circuits," 0-7803-5832-5/99-IEEE, 1999, pp. 200-203.

* cited by examiner

T = 0.1p/(0.1 + 0.2 + 0.2) = 0.2p

Delta = 4 * (4 - 1)/2 - 4 - 1 = 1

T = 0.1p/(0.1 + 0.2 + 0.2) = 0.2p

Delta = 4 * (4 - 1)/2 - 4 - 2 = 0

FAST REDUCTION OF SYSTEM MODELS

BACKGROUND

In VLSI circuit design, electrical circuit analysis and simulation are important in predicting overall system yield and performance, through accurate and fast timing, power, and noise evaluation. As an example, timing analysis depends on a careful analysis of RC parasitics that are extracted from the physical design layout. Meanwhile, feature size is shrinking with every new process generation; therefore, there are multiple challenges never experienced by the semiconductor design community before. One problem is due to the dramatic increase in the amount of parasitics extracted from the physical design layout, which makes electrical analysis and especially simulation run slow or even be impossible to run.

Techniques have been proposed for reducing the extracted parasitics to allow the timing and simulation to run faster. FIG. 1 shows a general flow for parasitics reduction, in which parasitics are extracted 104 from a physical design layout 102, and then reduced 106. Finally, analysis or simulation 108 is performed.

Unfortunately, some parasitics reduction techniques are not realizable. That is, the reduction may preserve the electrical properties at the ports, but is not realizable as an RC network. Other parasitics reduction techniques are realizable. However, the realizable reduction technique itself may be very computationally intensive. Moreover, the realizable reduction technique may only work on limited circuit topologies. Thus, the benefit of reducing the parasitics is curtailed.

FIG. 2 shows a general flow for parasitics reduction in which a parasitics netlist is constructed 202 from a circuit design, then nodes and devices that cannot be eliminated from the parasitics netlist are marked 204. After identifying nodes for elimination 206, the identified nodes and their associated devices are eliminated 208. However, eliminating a node may require adding devices such that the electrical properties of RC network are preserved, which can lead to increasing the number of devices in the parasitics netlist. Some parasitics reduction techniques may have a criterion of not significantly increasing the number of devices when eliminating a node. The need to increase the number of devices when eliminating a node depends on the circuit topology. Thus, some parasitics reduction techniques only work well for limited types of circuit topologies.

In order to determine whether some parasitics reduction techniques may be applied, it may be necessary to identify the circuit topologies that are suitable for parasitics reduction. However, identifying the suitable topologies is itself a problem having superlinear complexity. Because of this, the benefit of parasitics reduction may be limited by the heavy cost of identifying suitable topologies for reduction.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

Techniques are provided for fast reduction of a system model, such as fast parasitics reduction of an electrical design. In one embodiment, delta loops are identified in a netlist that models a system. A delta loop comprises three nodes connected by three edges. After the delta loops are identified, the netlist can be annotated with information such as the number of delta loops to which an edge belongs and a delta loop identifier. In one embodiment, delta loops that share an edge are assigned the same identifier.

In one embodiment, identifying delta loops is performed by generating a first binary search tree (BST) for a first node and a second BST for a second node. The two nodes may be connected by an edge. The intersection of the first and second BST is then determined. For each node in the intersection, a delta loop is identified as including the first node, second node, and the node in the intersection.

In one embodiment, a cost of removing a node from a netlist of a system model is determined. In this embodiment, each edge that is connected to a node under consideration for removal is annotated with certain information regarding delta loops. That information may include the number of delta loops to which an edge belongs and a delta loop identifier. In one embodiment, delta loops that share an edge are assigned the same identifier. Other edges in the netlist may be annotated, as well. Based on the information annotated to the edges connected to a node under consideration for removal, pairs of edges that share a common delta loop are identified, which results in a determination of the total number of delta loops that are shared by the pairs of edges. Based, at least in part, on the total number of common delta loops, a cost is determined of removing the node under consideration for removal from the netlist. The cost may also be based on the number of edges that are connected to the node under consideration for removal. In one embodiment, a determination as to whether to remove the node is based, at least in part, on whether the cost is greater than a threshold. The determination may also be based on information such as properties associated with the edges, such as resistance and capacitance.

If the node is removed from the netlist, a new edge may be added to the netlist as a result of removing the node. If so, the new edge(s) are annotated with information regarding delta loops. Furthermore, existing nodes may have their delta information updated based on the new netlist configuration.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENT(S)

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Building a Parasitics Netlist

Figure 1:
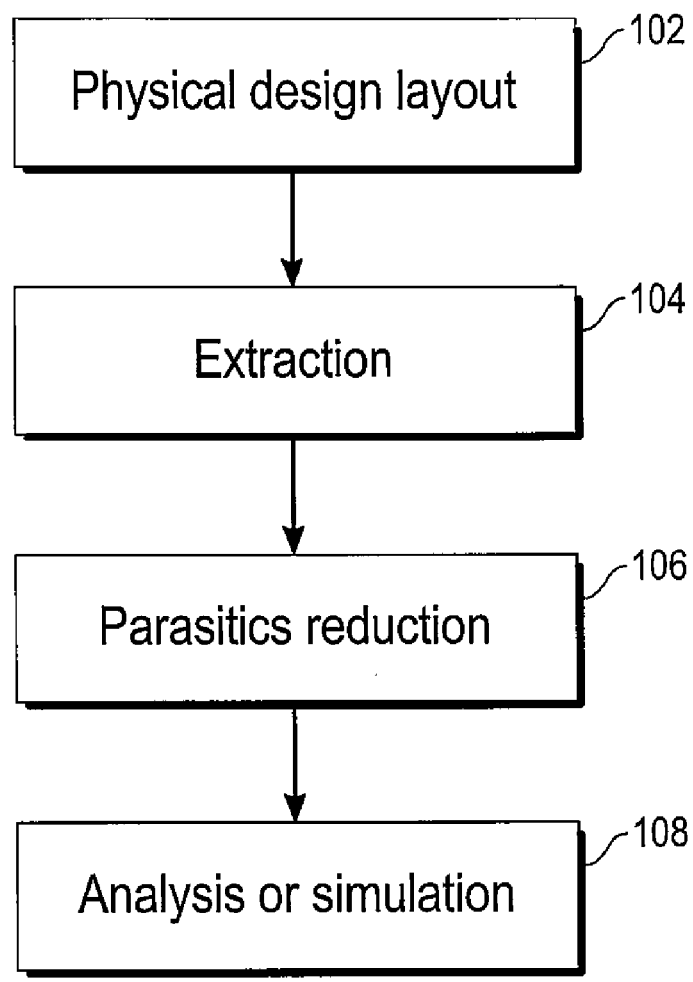
FIG. 1 shows a general flow of parasitics extraction, reduction, and simulation.
Figure 2:
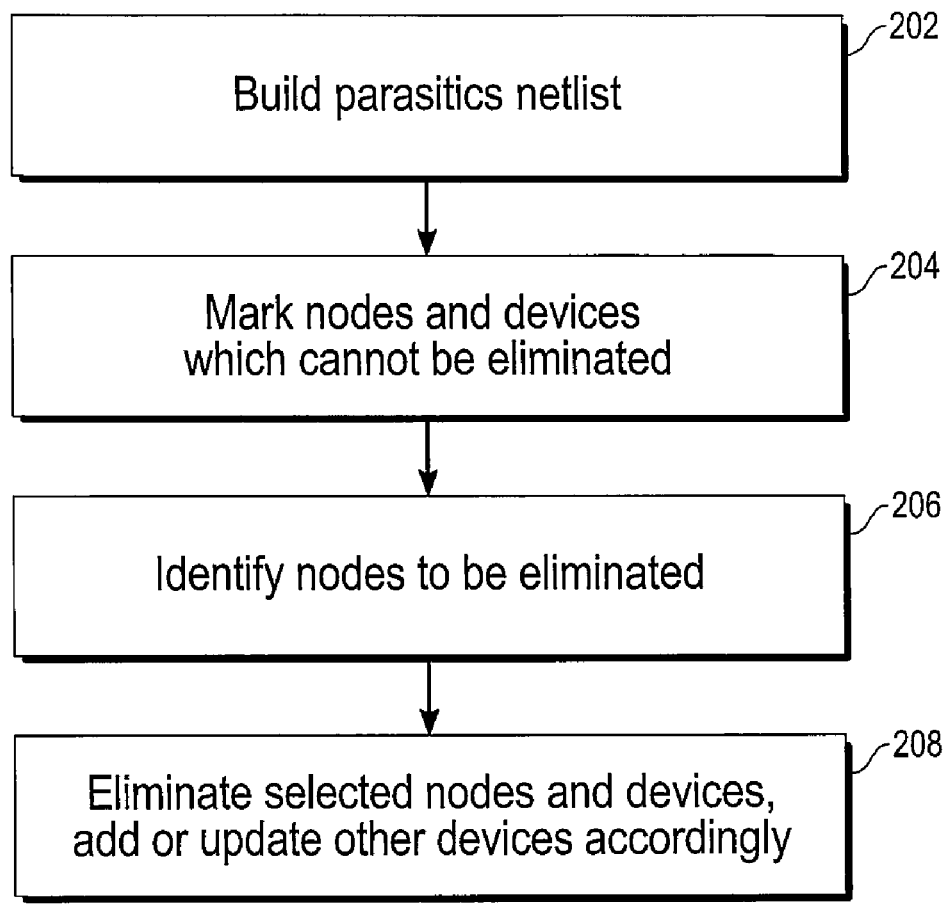
FIG. 2 shows a general flow for parasitics reduction.
Figure 3:
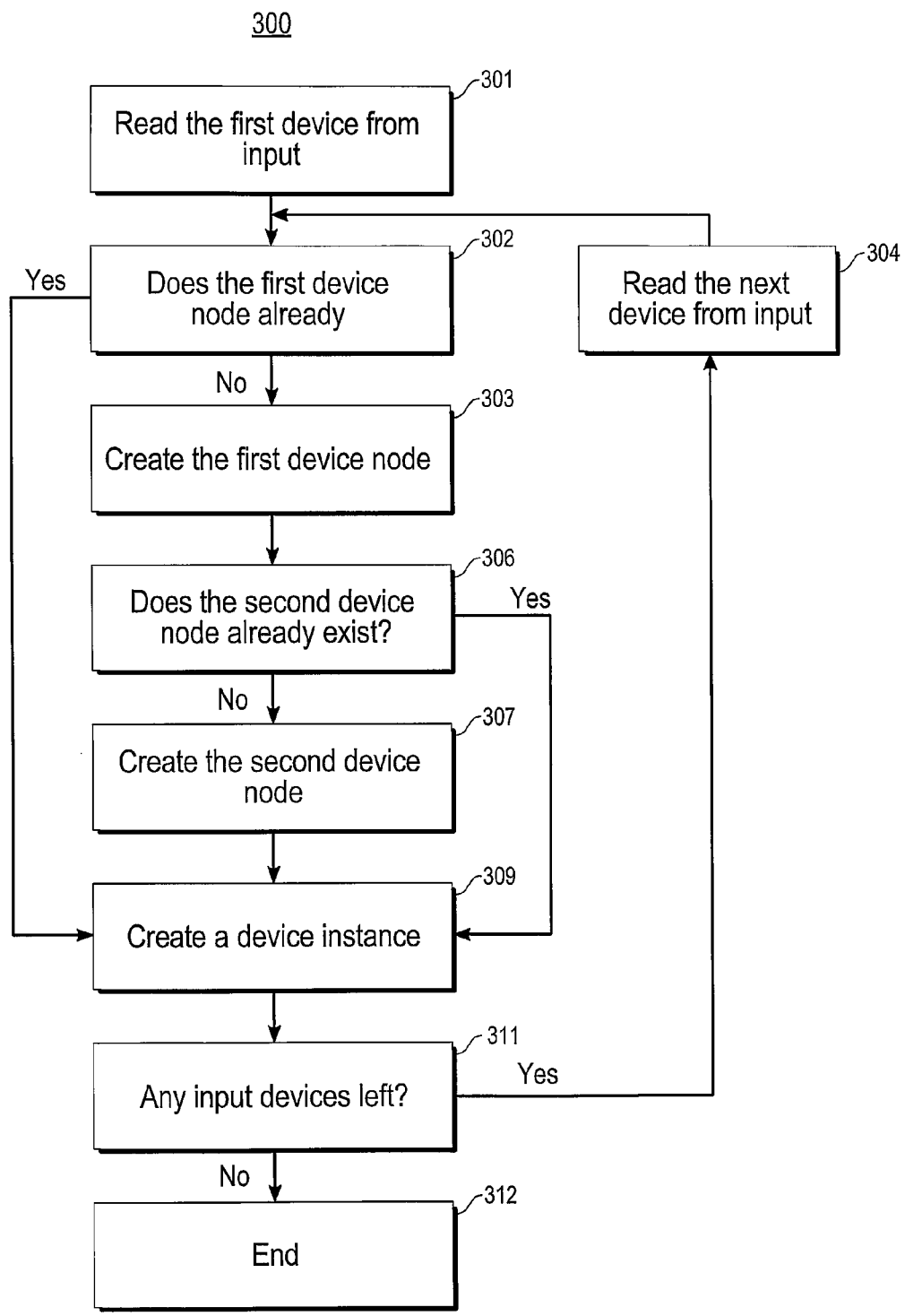
FIG. 3 is a flowchart of a process of building a parasitic net list, in accordance with an embodiment of the present invention.
Figure 4A:
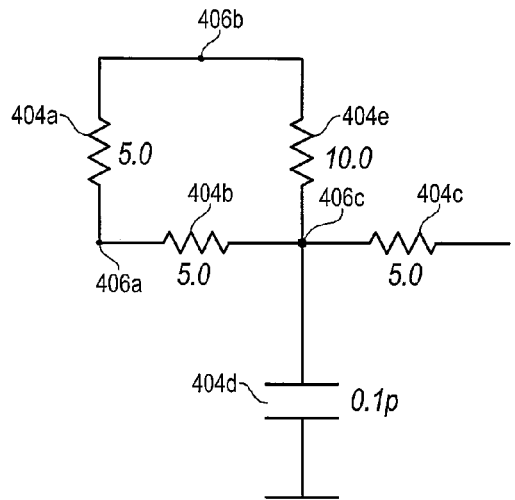
FIG. 4A and FIG. 4B depict a small portion of a parasitic net list being constructed.
Figure 4B:
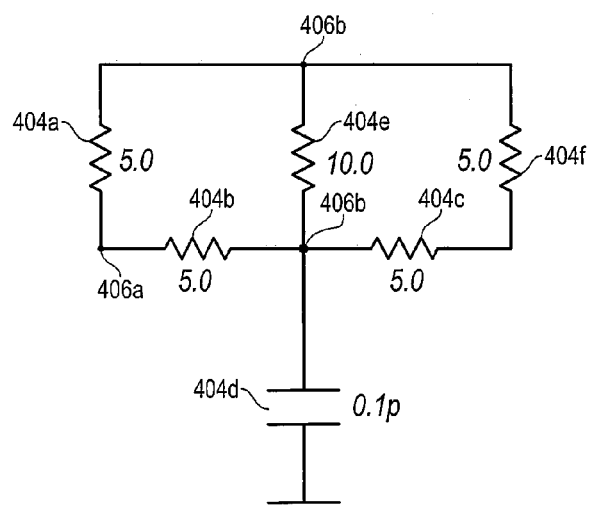

FIG. 3 is a flowchart of a process 300 of building a parasitic net list, in accordance with an embodiment of the present invention. In general, process 300 involves reading an input file, and for each device in the file, creating a device instance and two nodes for the device in the parasitics netlist. FIG. 4A and FIG. 4B depict a small portion of a parasitic net list being constructed. The netlists in FIG. 4A includes devices 404a-404e and nodes 406a-406c. FIG. 4B depicts the netlist of FIG. 4A after device 404f has been added. Process 300 also involves "delta loop" identification and "delta loop enumeration", which will be discussed more fully below. Referring to FIGS. 4A and 4B a delta loop comprises three devices joined in a loop. Thus, FIG. 4A has a single delta loop, whereas FIG. 4B has two.

In step 301, a device is read from the input file. The file includes parasitics that are extracted from a physical design layout, in an embodiment. For example, the file may describe a resistor-capacitor (RC) network. Thus, the device is either a resistor or capacitor, in one embodiment. The sequence of steps then depends on whether the nodes for the device already exist in the parasitics netlist. If both nodes for the device already exist in the parasitics netlist, then step 308 is performed. In step 308, a determination is made as to whether both of the device nodes share the same neighbor node in the parasitics netlist. If so, a delta loop has been identified. As an example, adding device 404f to FIG. 4B will be discussed. Referring to FIG. 4B, device 404f has nodes 406b and 406d. Node 406c is a neighbor node to each of nodes 406b and 406d. Thus, device 404f is a part of a delta loop. Further details of identifying the delta loop are discussed below.

Continuing on with process 300 after step 308, a device instance is created for the new device, in step 309. In step 310, the device instance is updated with the number of delta loops to which it belongs. Furthermore, a unique identifier is assigned to every delta loop or set of delta loops that share an edge. Continuing with the example, device 404f is added to the netlist and also gets annotated (annotations not depicted in FIG. 4B). Because the two delta loops share an edge (device 404e), they are assigned the same identifier. If there are more devices in the file, control then proceeds to step 304 to read the next device from the input file.

When reading in a new device, if either device node is missing from the parasitics netlist, then the missing device node is created in the parasitics netlist (steps 303, 307). In either of these cases delta loop identification is not performed, in this embodiment. Thus, after creating the missing nodes in the netlist, control passes to step 309 to create the device instance in the netlist. After all devices have been read from the input file, process 300 concludes.

Binary Search Trees

Some embodiments of the present invention make use of binary search trees (BST) to determine if a delta loop results by adding a device to the parasitic netlist. In particular, random BSTs are used in some embodiments. The following discussion and example is provided for illustrative purposes. Each BST node has a value, a left pointer, a right pointer, and a priority. The priority for each node may be randomly assigned. If the priority is randomly assigned, then the BST is referred to herein as a random BST.

Figure 5A:
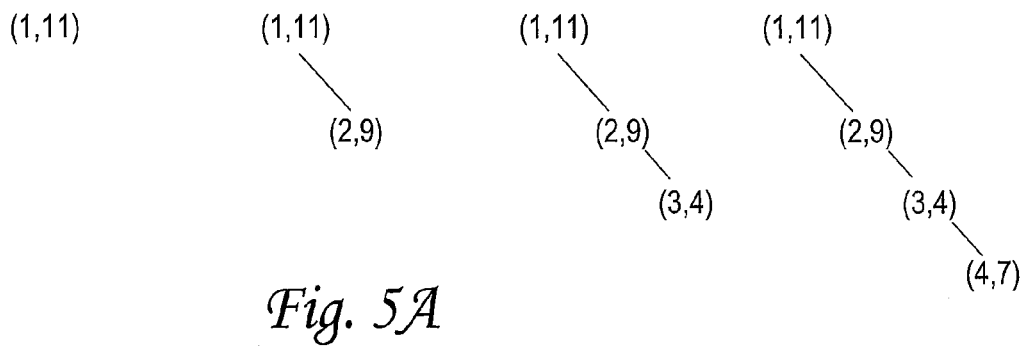
FIGS. 5A, 5B, and 5C depict an example of a binary search tree (BST) being constructed.
Figure 5B:
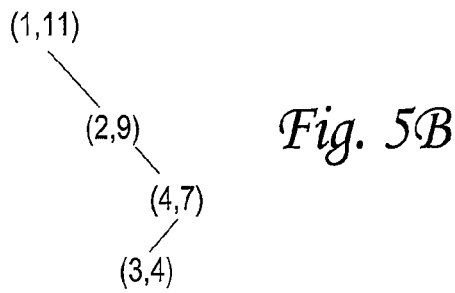
Figure 5C:
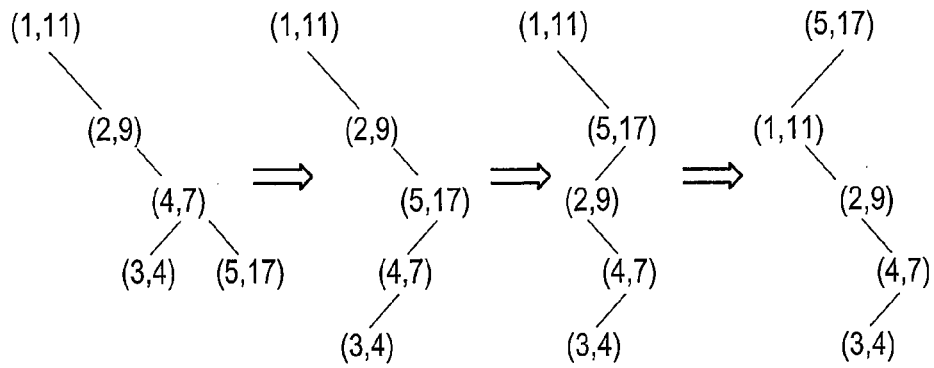

To construct a random BST, the following rules are applied: 1) for any node, x, all nodes in the left subtree of x have values less than x's value; 2) all nodes in the right subtree of x have values greater than x's value; and 3) all of the ancestors of x have priorities higher than x and all descendants of x have priorities less then x (referred to as "heap-order"). The rules are applied recursively to left and right sub-trees. FIGS. 5A, 5B, and 5C depict an example of a BST being constructed for a set of elements {1,2,3,4,5} having randomly assigned priorities {11,9,4,7,17}. In FIG. 5A, the first three elements are inserted in a straightforward fashion, as each node has a lower priority than its predecessor. Because the fourth element has a higher priority than its parent, rotation is required, as depicted in FIG. 5B.

Inserting the fifth element requires several rotations because the fifth element has the highest priority. FIG. 5C depicts a sequence of rotations that result in the fifth element reaching the top of the random BST.

Delta Loop Identification

Figure 6:
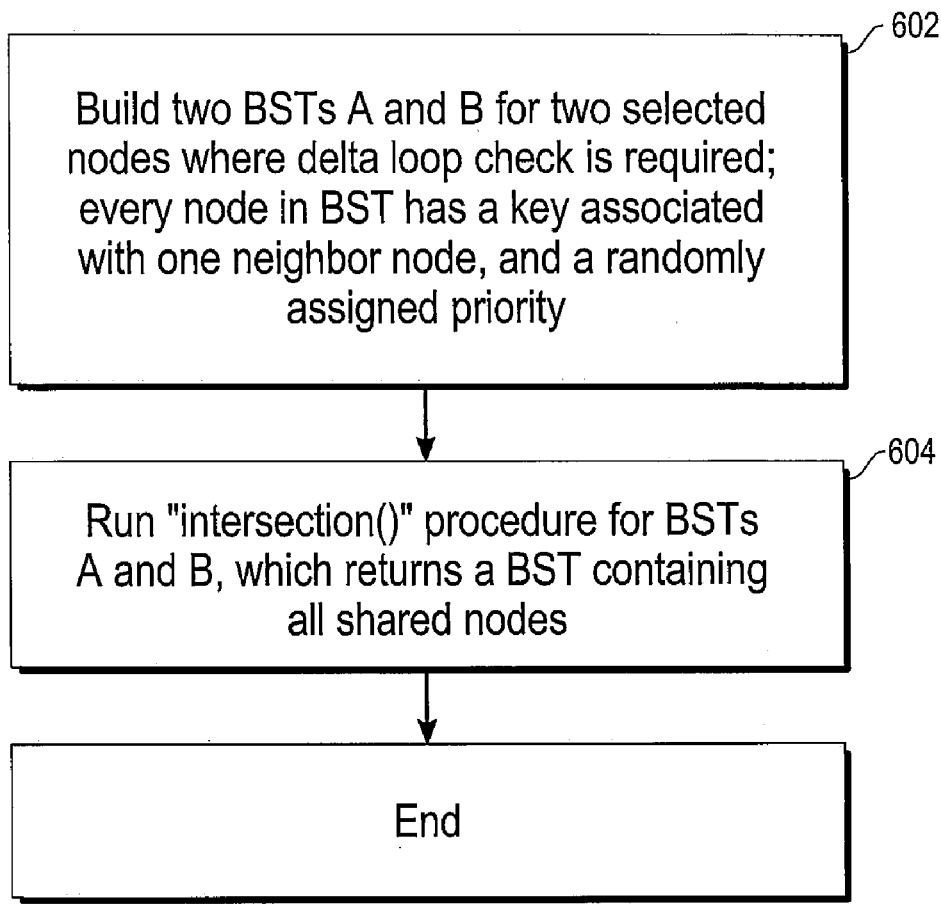
FIG. 6 is a flowchart illustrating steps of a process of delta loop identification, in accordance with an embodiment.
Figure 7:
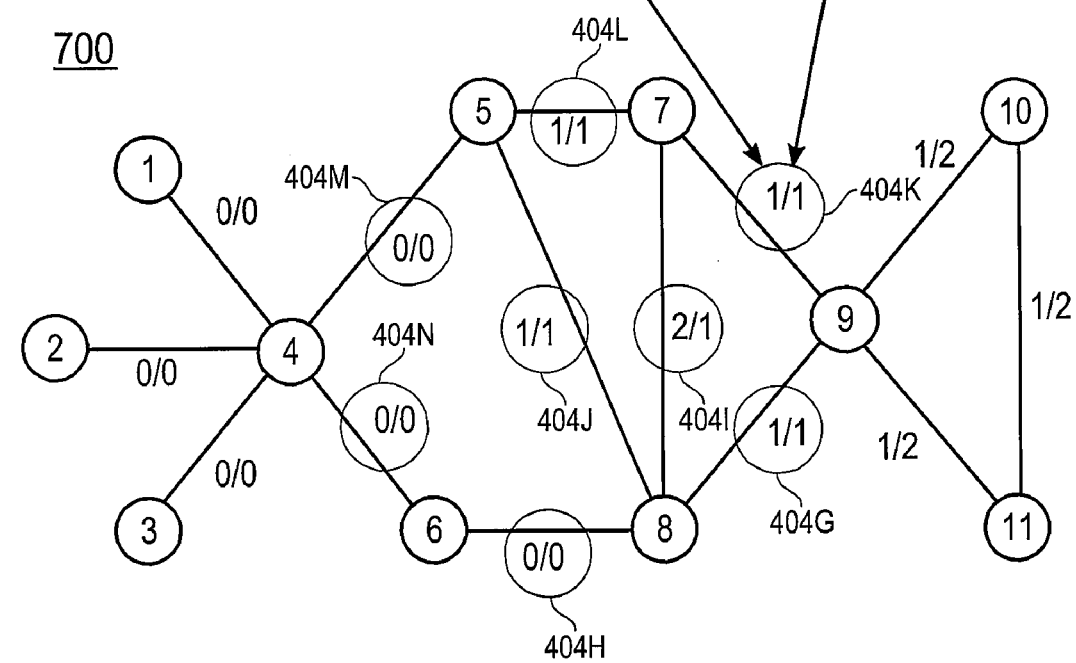
FIG. 7 depicts a parasitic netlist with annotated edges after performing the process of FIG. 6, in accordance with an embodiment.

FIG. 6 is a flowchart illustrating steps of a process 600 of delta loop identification, in accordance with an embodiment. Process 600 is used to implement step 308 of process 300, in one embodiment. FIG. 7 depicts a parasitic netlist 700 with annotated edges after performing process 600. Some of the edges have been provided reference numerals (devices 404g-404n) for later discussion. In the annotations, the first number represents the number of delta loops to which a device belongs, and the second number is a delta loop identifier. In this example, delta loops that share an edge are assigned the same identifier.

In step 602, a binary search tree (BST) is constructed for two nodes for which a delta loop check is desired. In an embodiment, the BST is a random BST. Referring back to the example used to discuss process 300, when the new device 404f was being placed in the parasitics netlist in step 308, it was determined that both nodes 406b and 406d already existed in the parasitics netlist of FIG. 4B. A BST would be constructed for each node 406b and 406d.

Figure 8:
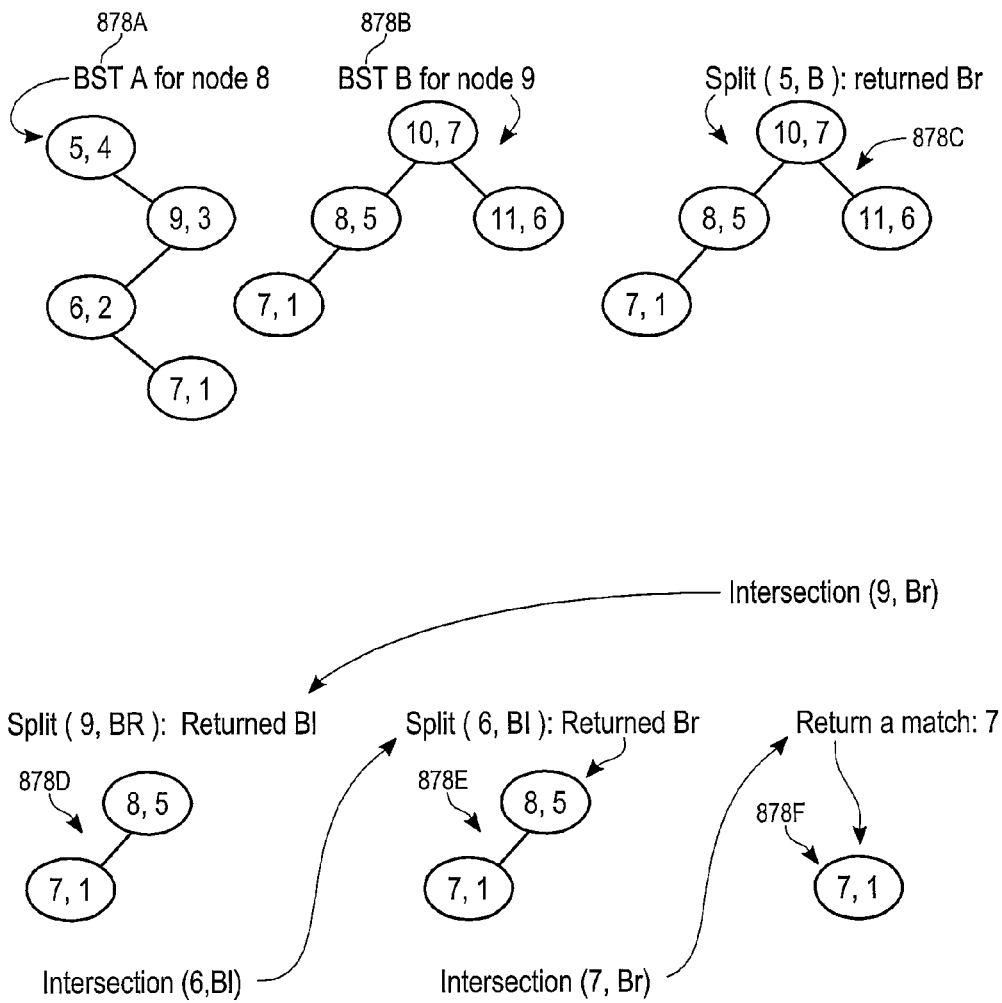
FIG. 8 shows BSTs in a process in accordance with an embodiment.

Because FIG. 7 shows a more complete netlist than FIG. 4B, FIG. 7 will be used for further illustration. FIG. 8 shows a BST 878A for node 8 of FIG. 7 and a BST 878B of node 9 of FIG. 7. A BST for a particular node contains a BST node for every neighbor node in the parasitics netlist. For example, node 8 has neighbors 5, 6, 7, and 9. The priorities associated with these nodes are random, in an embodiment.

In step 604, the intersection of the BSTs is computed to generate an intersection BST. The nodes in the intersection BST are all of the nodes that nodes 8 and 9 have in common. BSTs 878C-878F of FIG. 8 depict computing the intersection of the BSTs for nodes 8 and 9, resulting in a determination that node 7 is in the intersection (878F). This technique allows the delta loops to be quickly identified. Further details of step 604 of determining the BST intersection are discussed below.

Determining the Intersection BST

Figure 9:
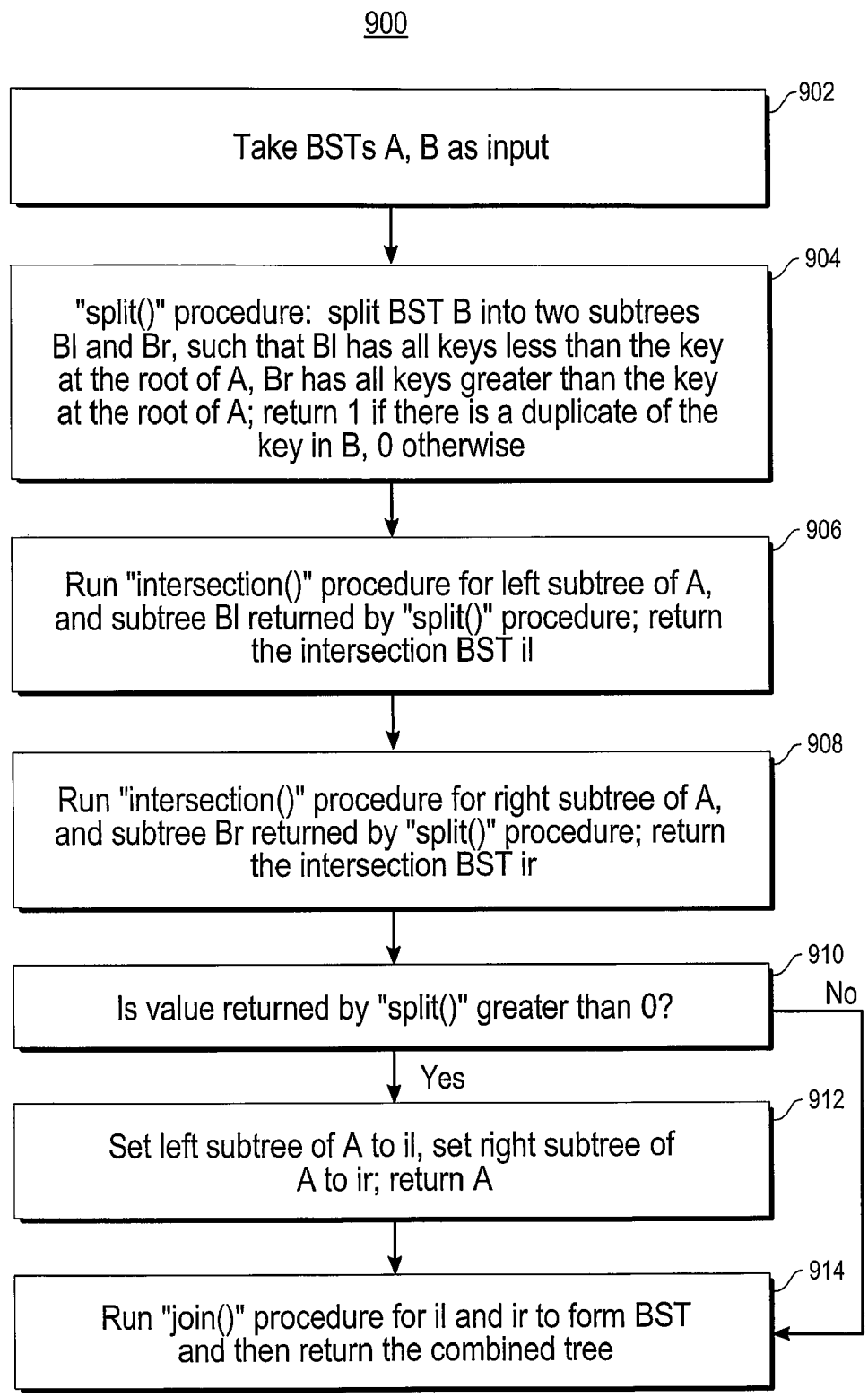
FIG. 9 depicts a process of determining an intersection BST, in accordance with an embodiment.

FIG. 9 depicts a process 900 of determining the intersection BST, in accordance with an embodiment. Process 900 will be discussed in conjunction with FIGS. 8A-8F. In step 902, two BSTs, BST A and BST B, are taken as input. The parasitic netlist node number of the nodes in the BSTs are referring to as "keys" in the following discussion. In step 904, BST B is split into two subtrees Bl and Br, such that all of the keys in subtree Bl are less than the key at the root of BST A, and subtree Br has all keys greater than the key at the root of BST A. BST 878C of FIG. 8 depicts subtree Br. In this case subtree Bl is null, as all of the keys of BST B are greater than 5.

Pseudocode for splitting a BST is described below. The input to a split routine described in the pseudocode is a key (in this example 5), and a BST (in this case BST B). The output of the split routine are a left tree (in this case null) and a right tree (in this case BST Br). If BST B contains a duplicate of the key, then this is noted (e.g., a one is returned). In this example, BST B does not contain the key (5).

In step 906, the intersection of the left subtree of BST A and subtree Bl is determined. Referring to BST 878A of FIG. 8, there is no left subtree of BST A. In one embodiment, step 906 involves recursively calling an intersection subroutine. Step 906 returns an intersection referred to as BST il.

In step 908, the intersection of the right subtree of BST A and subtree Br is determined. Referring to BST 878A of FIG. 8, the right subtree of BST A is the portion of the BST A with the root node of 9. The root node will be used as a key below. In one embodiment, step 908 involves recursively calling an intersection subroutine. Step 908 returns an intersection referred to as BST ir.

BSTs 878D-F of FIG. 8 show the progression of step 908 as the intersection routine is recursively invoked by either step 906 or 908 (which results in invoking the split procedure in step 904). First an intersection routine is invoked using 9 as the key and subtree Br. As previously discussed 9 is used as the key because it is the root of the right subtree of BST A. BST 878D shows the result of splitting subtree Br using the key 9 (which results from performing step 904). In this example, the result is subtree Bl.

Next the intersection routine is invoked for subtree Bl using 6 as the key. The reason for this step is that step 906 is being performed. In this case, the key is 6 because it is the root of the left subtree of the subtree of BST whose root is 9. BST 878E shows a right subtree that is returned by the present invocation of the intersection routine.

Next the intersection routine is invoked on the just returned subtree Br, using 7 for the key. The key is 7 in this case because it is the right subtree of the subtree of BST A whose root is 6. In other words, the intersection routine is being invoked due to processing step 908. BST 878F shows the final result. Also, because the key was found, the routine returns a flag indicating that a match was found.

In step 910, if step 904 determined that BST B had a duplicate of the key, then the left subtree of BST A is set to BST il and the right subtree of BST A is set to BST ir, in step 912.

If, however, step 904 determined that BST B did not have a duplicate of the key, then BST il and BST ir are joined to formed a combined tree, in step 914. Example pseudocode for joining BSTs is provided below.

Splitting a BST

Figure 10:
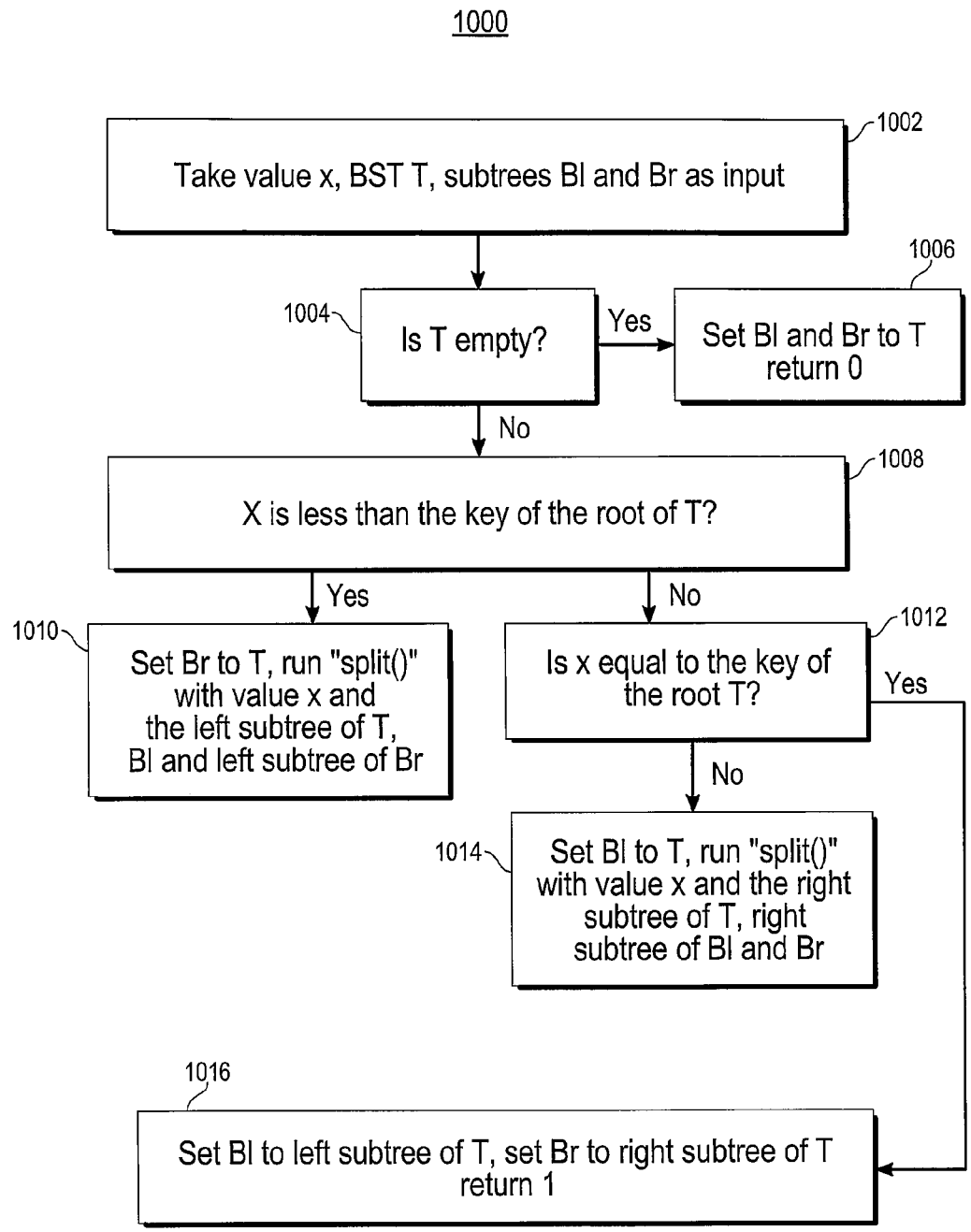
FIG. 10 illustrates a process of splitting a BST, in accordance with an embodiment.

This section describes splitting a BST, in accordance with an embodiment, and may be used in process 900. FIG. 10 illustrates a process 1000 of splitting a BST, in accordance with an embodiment. Example pseudocode for splitting a BST is provided below. The input received in step 1002 is a value "x", BST T, subtree Bl and subtree Br. If BST T is empty (step 1004), then the subtrees are set to T, and zero is returned, in step 1006. If BST T is not empty, the control passes to step 1008. If "x" is less than the key of the root of BST T, then Br is set to BST T and process 1000 is invoked recursively in step 1010 using as inputs: the value of "x", the left subtree of BST T, Bl, and the left subtree of Br.

On the other hand, if "x" is not less then the key of the root of BST T, then control passes to step 1012. In step 1012, the value of "x" is compared to the key of the root of BST T. If they are not equal, control passes to step 1014 then Bl is set to BST T and process 1000 is invoked recursively using as inputs: the value of "x", the right subtree of BST T, and the right subtree of Bl, and Br.

If "x" is equal to the key of the root of BST T, then control passes to step 1016. In step 1016 Bl is set to the left subtree of BST T, and Br is set to the right subtree of BST T. The process 1000 may return a value of one.

Example Pseudocode for Determining an Intersection of BSTs

Table I shows example pseudocode for determining an intersection of BSTs. The code corresponds to the flow of process 900. This code calls both the split and join routines that are described below.

TABLE I

```
bst intersection(bst A, bst B) {
    Bst Bl, Br, il, ir;
    Int rep;
    If (A ==NULL){
        Return NULL:
    }
    Rep = split(A->key,B,&Bl,&Br);
    Il=intersection(A->left,Bl):
    Ir=intersection(A->right,Br):
    If(rep) {
        A->left=il;
        A->right=ir;
        Return A;
    }
    Else {
        Return join(il,ir);
    }
}
```

Example Pseudocode for Splitting a BST

Table II shows example pseudocode for splitting a BST. The code corresponds to the flow of process 1000 and has recursive calls to itself.

TABLE II

```
Int split(int x, bst T, bst *Bl, bst *Br) {
    If (T ==NULL){
        *Bl = *Br = NULL;
        Return 0;
    }
    If (x < T->key){
        *Br = T;
        Return split(x, T->left, Bl, &(*Br->left));
    }
    Else if (x > T->key){
        *Bl = T;
        Return split(x, T->right, &(*Bl->right), Br);
    }
    Else{
        *Bl = T->left;
        *Br = T->right;
        Free_node(T);
        Return 1;
    }
}
```

Example Pseudocode for Joining BSTs

Table III shows example pseudocode for joining two BSTs. The code is called by the intersection routine above and could be used in the implementation of step 914 of process 900.

TABLE III

```
Bst join(bst Bl, bst Br){
    Bst T;
    If (Bl==NULL) return Br;
    If (Br==NULL) return Bl;
    If (Bl->priority > Br->priority){
        T=Bl;
        T->right = join(Bl->right, Br);
    }
    Else {
        T=Br;
        T->left=join(Bl, Br->left);
    }
    Return T;
}
```

Identification of Nodes to be Eliminated from Parasitics Netlist

Figure 11:
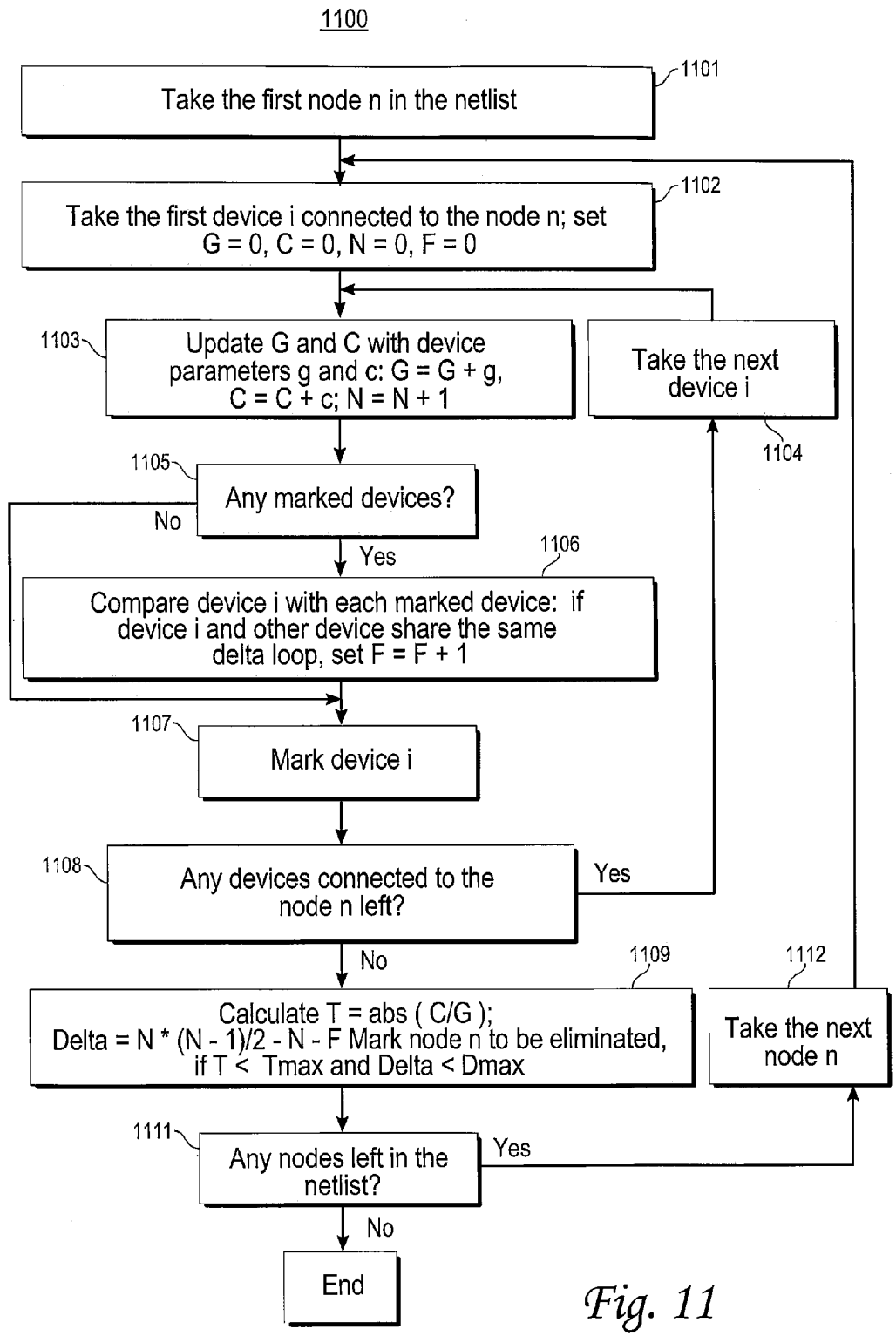
FIG. 11 depicts a flowchart of a process for identifying nodes to be eliminated from a parasitics netlist, in accordance with an embodiment.

FIG. 11 depicts a flowchart of a process 1100 for identifying nodes to be eliminated from the parasitics netlist, in accordance with an embodiment. Process 1100 includes determining whether two devices share the same delta loop in order to determine which nodes to eliminate. Process 1100 will be discussed in conjunction with FIG. 4B.

Process 1100 analyzes one node in the parasitics netlist at a time, in an outer loop between steps 1101 and 1111. For illustrative purposes, node 406b in FIG. 4B will be analyzed.

In step 1102, a first device that is coupled to the node 406b is analyzed. Device 404f will be used as an example of the first device. Parameters for conductance (G), capacitance (C), the number of device connected to the node (N), and the number of devices that share a delta loop (F) are initialized to zero, in step 1102.

In step 1103, G and C are updated with the values for the first device 404f. Moreover, N is incremented by one. During process 1100, devices are marked to indicate they have been analyzed. In step 1105, a determination is made as to whether there are any marked devices. If so, control passes to step 1106 to compare the device with the marked device. Otherwise step 1106 is bypassed. In step 1106, the first device 404f is compared with each marked device to determine if the first device 404f shares a delta loop with any other devices. The parameter F (number of delta loops) is incremented for each other device for which the first device 404f shares a delta loop. The first device 404f is then marked, in step 1107, and if there are more devices coupled to the node 406b under consideration, control passes to step 1104 to obtain the next device, and then to step 1103 to process the next device. Further details of determining whether two devices share a delta loop are discussed below.

After all devices that are coupled to the node have been processed, control passes to step 1109 to calculate a cost of removing the node from the netlist. In an embodiment, a cost of removing the node is calculated in accordance with the following equations:

$$T=Abs(C/G) \qquad (\text{Eq. 1})$$

$$Delta=N*(N-1)/2-N-F \qquad (\text{Eq. 2})$$

$$\text{if } T<Tmax \text{ AND } Delta<Dmax, \text{ then remove node} \qquad (\text{Eq. 3})$$

Delta is the number of devices that need to be added to the parasitic netlist as a consequence of removing the node. Equation 2 is based on rules that follow from the topology. As equation 3 indicates, if both the time constant (T) and delta are below respective thresholds, then the node can be removed. Referring to FIG. 7, node 8 has four edges and is a part of two delta loops. Referring to Equation 2, if node 8 were to be removed, then the cost in terms of Delta is 4*3/2−4−2=0. Thus, removing node 8 does not require a net increase in the number of edges (devices) in the netlist. If desired Equation 1 can be used to determine a factor based on properties associated with the edges, such as impedance or a time constant. Then, Equation 3 can be used to determine whether to remove node 8. Note that basing the decision on properties associated with the edges is optional.

If there are more nodes in the parasitic netlist to process, control passes from step 1111 to step 1110 to obtain the next node, and then to step 1102 to process the next node. When all nodes have been processed, process 1100 ends.

While process 1100 provides an example in which electrical devices are modeled in a network, the present invention is not so limited.

Determining Whether Two Devices Share a Delta Loop

Figure 12:
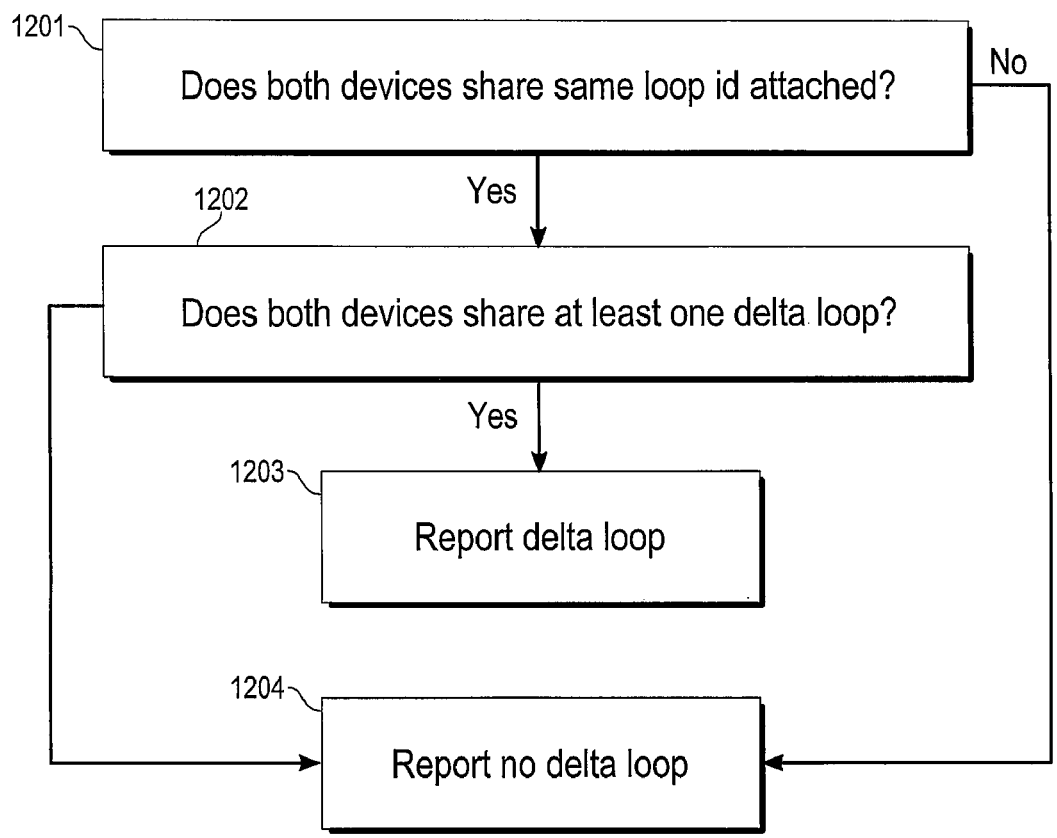
FIG. 12 depicts a flowchart of a process for determining whether two devices share a delta loop, in accordance with an embodiment.

FIG. 12 depicts a flowchart of a process 1200 for determining whether two devices share a delta loop, in accordance with an embodiment. Process 1200 may be used for step 1106 of process 1100. By this stage, devices have been annotated with IDs of delta loops to which they belong. FIG. 7 depicts an example of annotated devices. In step 1202, the delta loop ID's of each device are compared. If the devices share the same loop ID, then an additional check is made to determine whether the devices share at least one delta loop, in step 1203. Note that in this embodiment, adjacent delta loops share the same identifier. Thus, it is possible, in this embodiment, for two devices that have a delta loop with the same identifier to not have a delta loop in common (see e.g., FIG. 7).

If the devices share a delta loop ID and share the same delta loop, then the fact that there is a shared delta loop is reported, in step 1203.

If the devices do not share a delta loop ID or if the devices do not share a delta loop, then process 1200 reports that there is no delta loop in common, in step 1204.

Eliminating a Node from the Parasitic Netlist

Figure 13:
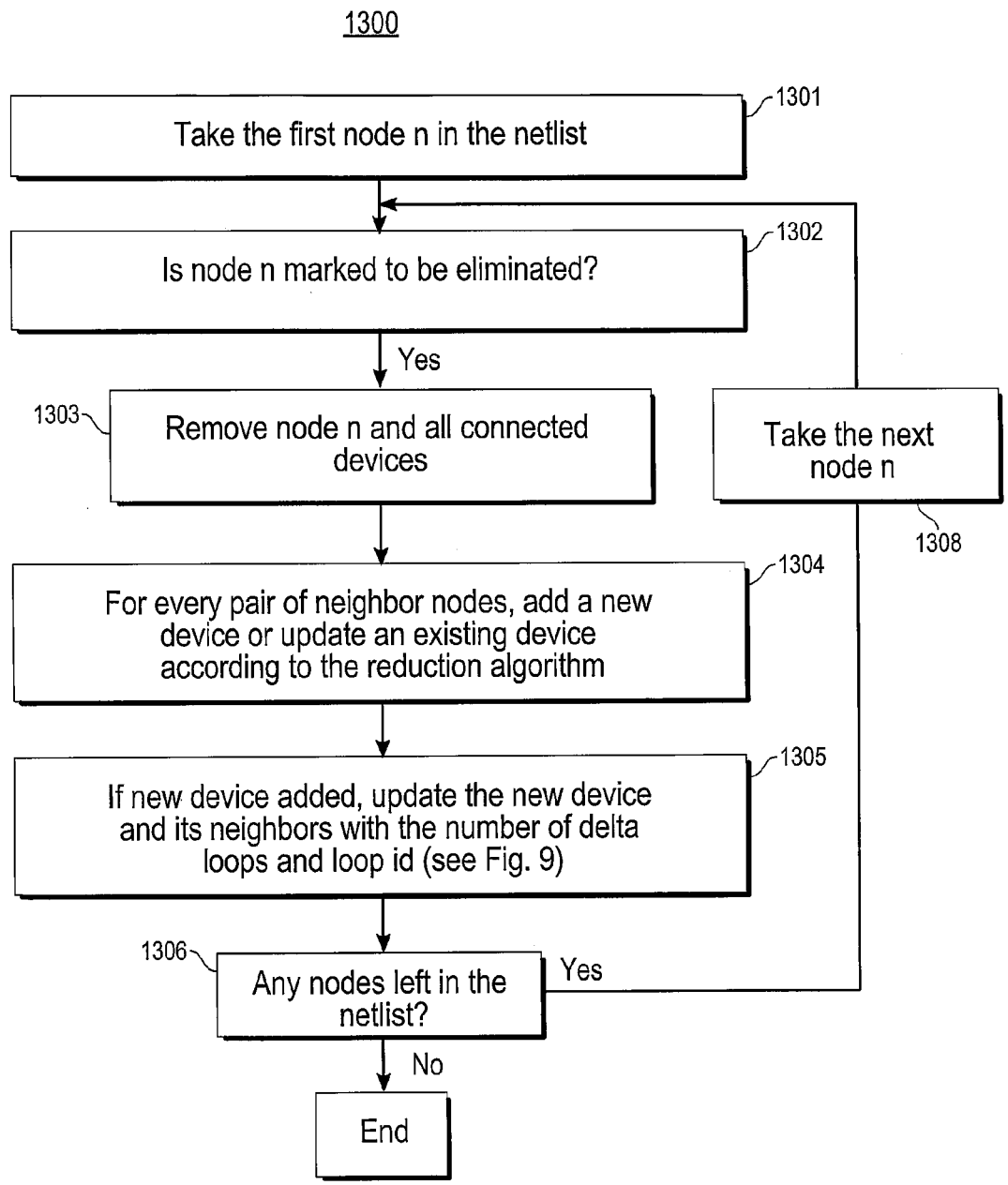
FIG. 13 depicts a flowchart of a process of eliminating a node from a netlist, in accordance with an embodiment.

FIG. 13 depicts a flowchart of a process 1300 of eliminating a node from a netlist, in accordance with an embodiment. In general, process 1300 comprises removing nodes marked for removal, adding devices to the netlist as needed due to node removal, and updating delta loop annotations in the parasitic netlist. Process 1300 removes one node at a time, with the new delta loop annotations being performed each time a node is removed. An example of removing node 8 from the netlist of FIG. 7 to arrive at the netlist of FIG. 14 will be used to illustrate process 1300.

In steps 1301 and 1302, the next node in the parasitic netlist is accessed and, if it has been marked for removal, control passes to step 1303. Otherwise, control passes to step 1306 to determine if there are more nodes in the parasitic netlist.

If the node is marked for removal, then the node and all devices connected to it are removed from the parasitic netlist, in step 1303. For example, node 8 and devices 404g-j are removed. In step 1304, for every pair of neighbor nodes, either a new device is added or an existing device is updated. For example, devices 404o-404r are added.

Figure 14:
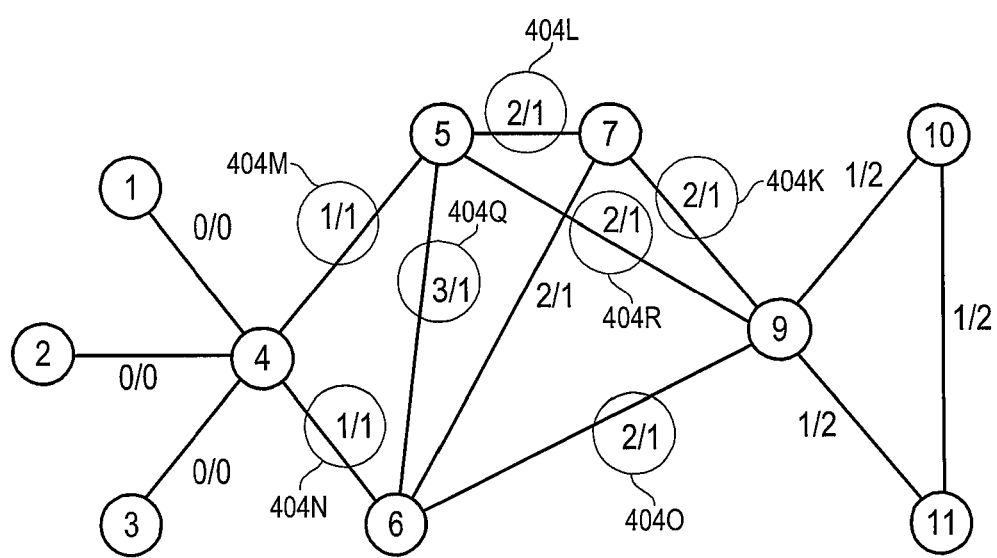
FIG. 14 depicts a netlist with a node removed, in accordance with an embodiment.

If a new device is added, then the new device and its neighbors are updated with the number of delta loops and the loop ID, in step 1305. For example, devices 404k-n are updated as depicted in FIG. 14. Moreover, devices 404o-404r are annotated. The updates can be achieved by starting with delta loop identification as described in process 600 of FIG. 6. Other processes such as process 900 and 1000 may also be performed. The delta loop identification only needs to be performed for a very small set of nodes in the vicinity of the removed node. Recall that processes 600, 900, and 1000 involved working with BSTs. In an embodiment, the BST for each node is saved such that it only needs to be updated at this point based on the new netlist configuration.

The new devices may also be assigned a value such as impedance. One technique for deriving impedance values for the new devices is described in the paper "Realizable Reduction of RLC Circuits Using Node Elimination" by Masud H. Chowdhury et al. published in the Proceedings of the 2003 international symposium on circuits and system, pages 494-497, which is included herein by reference for all purposes.

Hardware Overview

Figure 15:
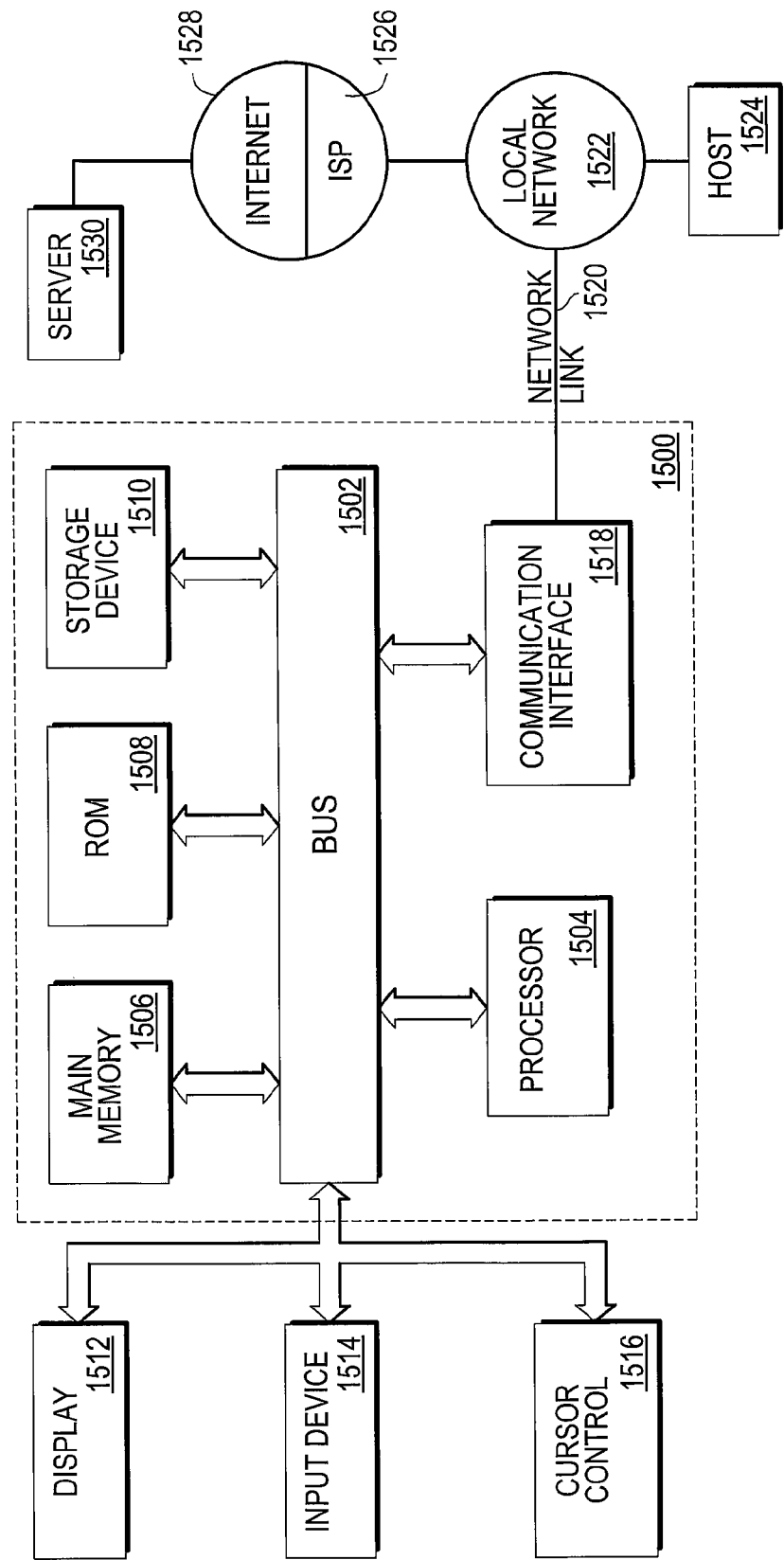
FIG. 15 depicts a computer system upon which embodiments of the present invention can be implemented.

FIG. 15 is a block diagram that illustrates a computer system 1500 upon which an embodiment of the invention may be implemented. Computer system 1500 includes a bus 1502 or other communication mechanism for communicating information, and a processor 1504 coupled with bus 1502 for processing information. Computer system 1500 also includes a main memory 1506, such as a random access memory (RAM) or other dynamic storage device, coupled to bus 1502 for storing information and instructions to be executed by processor 1504. Main memory 1506 also may be used for storing temporary variables or other intermediate information during execution of instructions to be executed by processor 1504. Computer system 1500 further includes a read only memory (ROM) 1508 or other static storage device coupled to bus 1502 for storing static information and instructions for processor 1504. A storage device 1510, such as a magnetic disk or optical disk, is provided and coupled to bus 1502 for storing information and instructions.

Computer system 1500 may be coupled via bus 1502 to a display 1512, such as a cathode ray tube (CRT), for displaying information to a computer user. An input device 1514, including alphanumeric and other keys, is coupled to bus 1502 for communicating information and command selections to processor 1504. Another type of user input device is cursor control 1516, such as a mouse, a trackball, or cursor direction keys for communicating direction information and command selections to processor 1504 and for controlling cursor movement on display 1512. This input device typically has two degrees of freedom in two axes, a first axis (e.g., x) and a second axis (e.g., y), that allows the device to specify positions in a plane.

The invention is related to the use of computer system 1500 for implementing the techniques described herein. According to one embodiment of the invention, those techniques are performed by computer system 1500 in response to processor 1504 executing one or more sequences of one or more instructions contained in main memory 1506. Such instructions may be read into main memory 1506 from another machine-readable medium, such as storage device 1510. Execution of the sequences of instructions contained in main memory 1506 causes processor 1504 to perform the process steps described herein. In alternative embodiments, hard-wired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 1500, various machine-readable media are involved, for example, in providing instructions to processor 1504 for execution. Such a medium may take many forms, including but not limited to storage media and transmission media. Storage media includes both non-volatile media and volatile media. Non-volatile media includes, for example, optical or magnetic disks, such as storage device 1510. Volatile media includes dynamic memory, such as main memory 1506. Transmission media includes coaxial cables, copper wire and fiber optics, including the wires that comprise bus 1502. Transmission media can also take the form of acoustic or light waves, such as those generated during radio-wave and infra-red data communications. All such media must be tangible to enable the instructions carried by the media to be detected by a physical mechanism that reads the instructions into a machine.

Common forms of machine-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, an EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 1504 for execution. For example, the instructions may initially be carried on a magnetic disk of a remote computer. The remote computer can load the instructions into its dynamic memory and send the instructions over a telephone line using a modem. A modem local to computer system 1500 can receive the data on the telephone line and use an infra-red transmitter to convert the data to an infra-red signal. An infra-red detector can receive the data carried in the infra-red signal and appropriate circuitry can place the data on bus 1502. Bus 1502 carries the data to main memory 1506, from which processor 1504 retrieves and executes the instructions. The instructions received by main memory 1506 may optionally be stored on storage device 1510 either before or after execution by processor 1504.

Computer system 1500 also includes a communication interface 1518 coupled to bus 1502. Communication interface 1518 provides a two-way data communication coupling to a network link 1520 that is connected to a local network 1522. For example, communication interface 1518 may be an integrated services digital network (ISDN) card or a modem to provide a data communication connection to a corresponding type of telephone line. As another example, communication interface 1518 may be a local area network (LAN) card to provide a data communication connection to a compatible LAN. Wireless links may also be implemented. In any such implementation, communication interface 1518 sends and receives electrical, electromagnetic or optical signals that carry digital data streams representing various types of information.

Network link 1520 typically provides data communication through one or more networks to other data devices. For example, network link 1520 may provide a connection through local network 1522 to a host computer 1524 or to data equipment operated by an Internet Service Provider (ISP) 1526. ISP 1526 in turn provides data communication services through the world wide packet data communication network now commonly referred to as the "Internet" 1528. Local network 1522 and Internet 1528 both use electrical, electromagnetic or optical signals that carry digital data streams. The signals through the various networks and the signals on network link 1520 and through communication interface 1518, which carry the digital data to and from computer system 1500, are exemplary forms of carrier waves transporting the information.

Computer system 1500 can send messages and receive data, including program code, through the network(s), network link 1520 and communication interface 1518. In the Internet example, a server 1530 might transmit a requested code for an application program through Internet 1528, ISP 1526, local network 1522 and communication interface 1518.

The received code may be executed by processor 1504 as it is received, and/or stored in storage device 1510, or other non-volatile storage for later execution. In this manner, computer system 1500 may obtain application code in the form of a carrier wave.

In the foregoing specification, embodiments of the invention have been described with reference to numerous specific details that may vary from implementation to implementation. Some examples have been provided in which an RC netlist is reduced. However, the netlist might include other elements, such as indicators. Moreover, the system being reduced is not limited to an electrical network. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method, performed by a processor, of identifying delta loops in a netlist that models a system, wherein the netlist comprises nodes connected by edges that represent elements in the system, and wherein a delta loop comprises three nodes connected by three edges, said method comprising:
   for each of a plurality of pairs of nodes in the netlist:
   generating a first binary tree comprising nodes that are connected in the netlist to a first node of the pair;
   generating a second binary tree comprising nodes that are connected in the netlist to a second node of the pair;
   determining nodes that are in an intersection of the first and second binary trees; and
   for every node in the intersection, identifying a delta loop as comprising the first node, the second node, and the node in the intersection.

2. The method of claim 1, wherein each of the plurality of pairs of nodes are connected by a single edge, wherein the single edge represents an element in the system.

3. The method of claim 1, further comprising:
   annotating the netlist based on the identified delta loops.

4. The method of claim 1, wherein annotating the netlist comprises annotating each edge with an identifier of the delta loops to which it is a member.

5. The method of claim 4, wherein delta loops that share an edge are assigned the same identifier.

6. The method of claim 4, wherein annotating the netlist further comprises annotating each edge with the number of delta loops to which it is a member.

7. The method of claim 1, wherein the nodes in the first binary tree are randomly located, and wherein the nodes in the second binary tree are randomly located.

8. A non-transitory computer-readable medium carrying one or more sequences of instructions, which instructions, when executed by one or more processors, cause the one or more processors to carry out a method of identifying delta loops in a netlist that models a system, wherein the netlist comprises nodes connected by edges that represent elements in the system, and
   wherein a delta loop comprises three nodes connected by three edges, said method comprising the steps of:
   for each of a plurality of pairs of nodes in the netlist:
   generate a first binary tree comprising nodes that are connected in the netlist to a first node of the pair;
   generate a second binary tree comprising nodes that are connected in the netlist to a second node of the pair;
   determine nodes that are in an intersection of the first and second binary trees; and
   for every node in the intersection, identify a delta loop as comprising the first node, the second node, and the node in the intersection.

9. The non-transitory computer-readable medium of claim 8, further comprising one or more sequences of instructions, which instructions, when executed by one or more processors, cause the one or more processors to carry out the step comprising:
   annotate the netlist based on the identified delta loops.

10. The non-transitory computer-readable medium of claim 8, further comprising one or more sequences of instructions, which instructions, when executed by one or more processors, cause the one or more processors to carry out the steps comprising:
    annotate the netlist based on the identified delta loops; and
    annotate each edge with an identifier of the delta loops to which it is a member.

11. The non-transitory computer-readable medium of claim 10, wherein delta loops that share an edge are assigned the same identifier.

* * * * *